(12) United States Patent
Wu et al.

(10) Patent No.: US 10,854,514 B2
(45) Date of Patent: Dec. 1, 2020

(54) MICROELECTRONIC DEVICES INCLUDING TWO CONTACTS

(71) Applicant: Micron Technology, Inc., Boise, ID (US)

(72) Inventors: Tieh-Chiang Wu, Taoyuan (TW); Wen-Chieh Wang, Taoyuan (TW); Sheng-Wei Yang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/391,600

(22) Filed: Apr. 23, 2019

(65) Prior Publication Data

US 2019/0252251 A1 Aug. 15, 2019

Related U.S. Application Data

(62) Division of application No. 14/993,099, filed on Jan. 12, 2016, now Pat. No. 10,388,564.

(51) Int. Cl.
*H01L 21/768* (2006.01)
*H01L 21/764* (2006.01)
(Continued)

(52) U.S. Cl.
CPC ...... *H01L 21/76895* (2013.01); *H01L 21/764* (2013.01); *H01L 21/7682* (2013.01);
(Continued)

(58) Field of Classification Search
CPC ......... H01L 21/76895; H01L 21/76805; H01L 21/7682; H01L 21/76838; H01L 21/76853;
(Continued)

(56) References Cited

U.S. PATENT DOCUMENTS 5,324,683 A * 6/1994 Fitch .................. G01P 15/0802
148/DIG. 73
6,008,083 A 12/1999 Brabazon et al.
(Continued)

FOREIGN PATENT DOCUMENTS

TW 201349387 A 12/2013
TW 201351566 A 12/2013
TW 201426907 A 7/2014

OTHER PUBLICATIONS

Taiwanese Second Office Action from Taiwanese Application No. 105111668, dated Jul. 24, 2017, 14 pages with English translation.
(Continued)

*Primary Examiner* — Tuan A Hoang
(74) *Attorney, Agent, or Firm* — TraskBritt

(57) ABSTRACT

A memory device with a dielectric layer or an air gap between contacts and a method of making the same are disclosed. The method comprises a series of steps including forming a plurality of conductive lines having trenches therebetween; forming a contact layer in the trench; and forming a dielectric layer interposed in the contact layer and configured to divide the contact layer into two contacts. The method also comprises removing the dielectric layer to form a space and forming a cap layer over the two contacts to form an air gap therein. The method further comprises forming a second air gap between the conductive line and the two contacts.

19 Claims, 13 Drawing Sheets

(51) Int. Cl.
*H01L 29/06* (2006.01)
*H01L 27/108* (2006.01)
*H01L 27/11582* (2017.01)
*H01L 49/02* (2006.01)
*H01L 29/49* (2006.01)

(52) U.S. Cl.
CPC ...... *H01L 21/76805* (2013.01); *H01L 27/108* (2013.01); *H01L 27/11582* (2013.01); *H01L 28/00* (2013.01); *H01L 29/0649* (2013.01); *H01L 21/76838* (2013.01); *H01L 21/76883* (2013.01); *H01L 27/10823* (2013.01); *H01L 27/10876* (2013.01); *H01L 29/4991* (2013.01)

(58) Field of Classification Search
CPC ......... H01L 21/76883; H01L 27/11582; H01L 27/7682; H01L 27/10823; H01L 27/10876; H01L 27/108; H01L 27/764; H01L 29/4991; H01L 29/0649; H01L 29/66613–66628; H01L 29/42336; H01L 29/42352; H01L 29/42356; H01L 29/4236; H01L 27/10805; H01L 27/10808
See application file for complete search history.

(56) References Cited

U.S. PATENT DOCUMENTS

| | | | |
|---|---|---|---|
| 6,114,725 A | 9/2000 | Furukawa et al. | |
| 6,150,687 A | 11/2000 | Noble et al. | |
| 6,875,660 B2 | 4/2005 | Hung et al. | |
| 7,772,702 B2* | 8/2010 | Bielefeld | H01L 21/76804 257/758 |
| 8,168,521 B2* | 5/2012 | Jeon | H01L 21/823437 257/E21.621 |
| 8,803,324 B2* | 8/2014 | Lee | H01L 23/5222 257/774 |
| 9,419,001 B1* | 8/2016 | Yang | H01L 27/10888 |
| 2010/0240180 A1* | 9/2010 | Jeon | H01L 21/823437 438/239 |
| 2011/0241103 A1* | 10/2011 | Curatola | B82Y 10/00 257/329 |
| 2012/0178235 A1 | 7/2012 | Pachamuthu et al. | |
| 2012/0199886 A1* | 8/2012 | Horak | H01L 21/76897 257/288 |
| 2012/0281490 A1* | 11/2012 | Cho | H01L 27/10876 365/205 |
| 2013/0049132 A1* | 2/2013 | Doris | H01L 21/7682 257/383 |
| 2013/0095629 A1 | 4/2013 | Ando et al. | |
| 2013/0328199 A1 | 12/2013 | Yun et al. | |
| 2014/0187037 A1* | 7/2014 | Rho | H01L 21/76877 438/626 |
| 2014/0264727 A1* | 9/2014 | Kim | H01L 27/10888 257/516 |
| 2014/0361403 A1 | 12/2014 | Cho et al. | |
| 2015/0214152 A1 | 7/2015 | Park | |
| 2015/0262860 A1* | 9/2015 | Kao | H01L 21/7682 257/774 |
| 2015/0371946 A1 | 12/2015 | Segawa | |
| 2016/0118388 A1* | 4/2016 | Tonari | H01L 27/10876 438/253 |
| 2017/0047242 A1* | 2/2017 | Sun | H01L 21/764 |
| 2017/0200723 A1* | 7/2017 | Lee | H01L 29/0649 |

OTHER PUBLICATIONS

Taiwanese Office Action and Search Report from Taiwanese Application No. 105111668, dated Jan. 25, 2017, 11 pages.
Chinese Office Action and Search Report from Chinese Application No. 201610240090.0, dated Apr. 25, 2019, 16 pages.
Chinese Office Action and Search Report from Chinese Application No. 201610240090, dated Dec. 3, 2019, 16 pages.

* cited by examiner

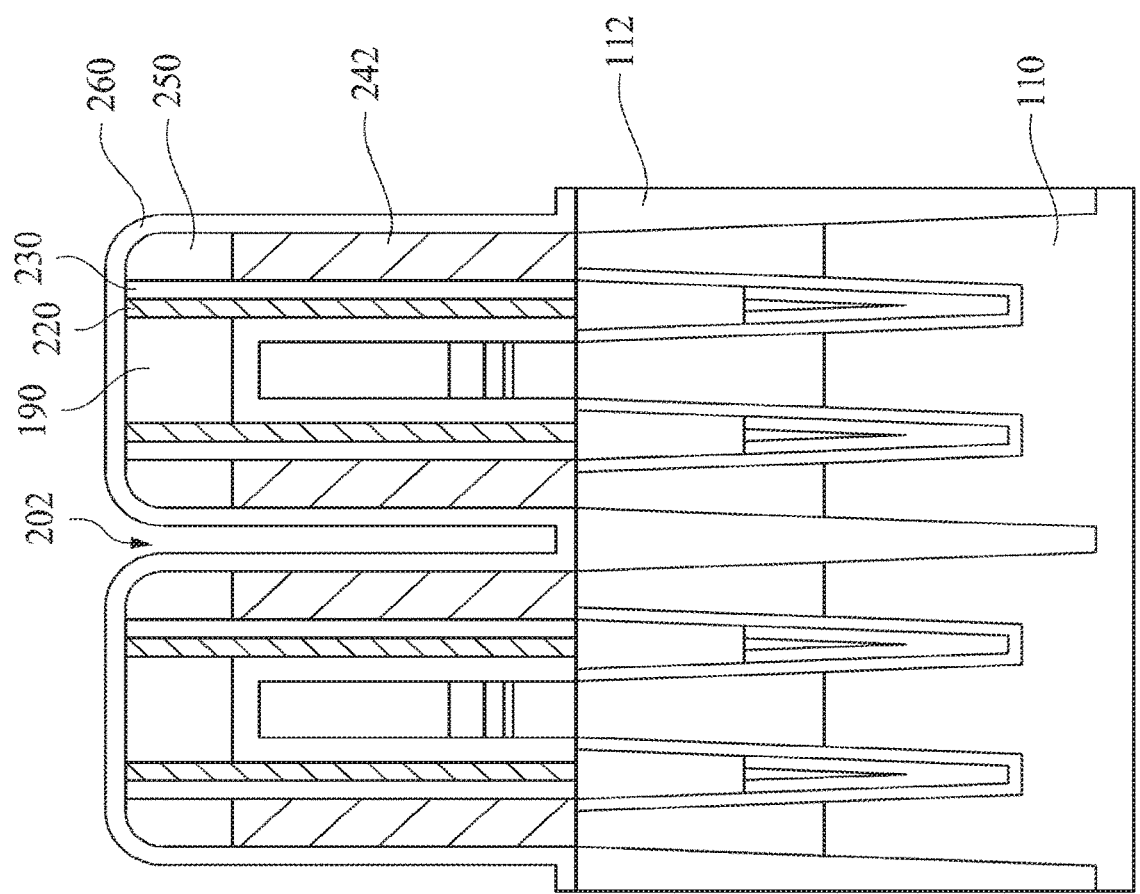

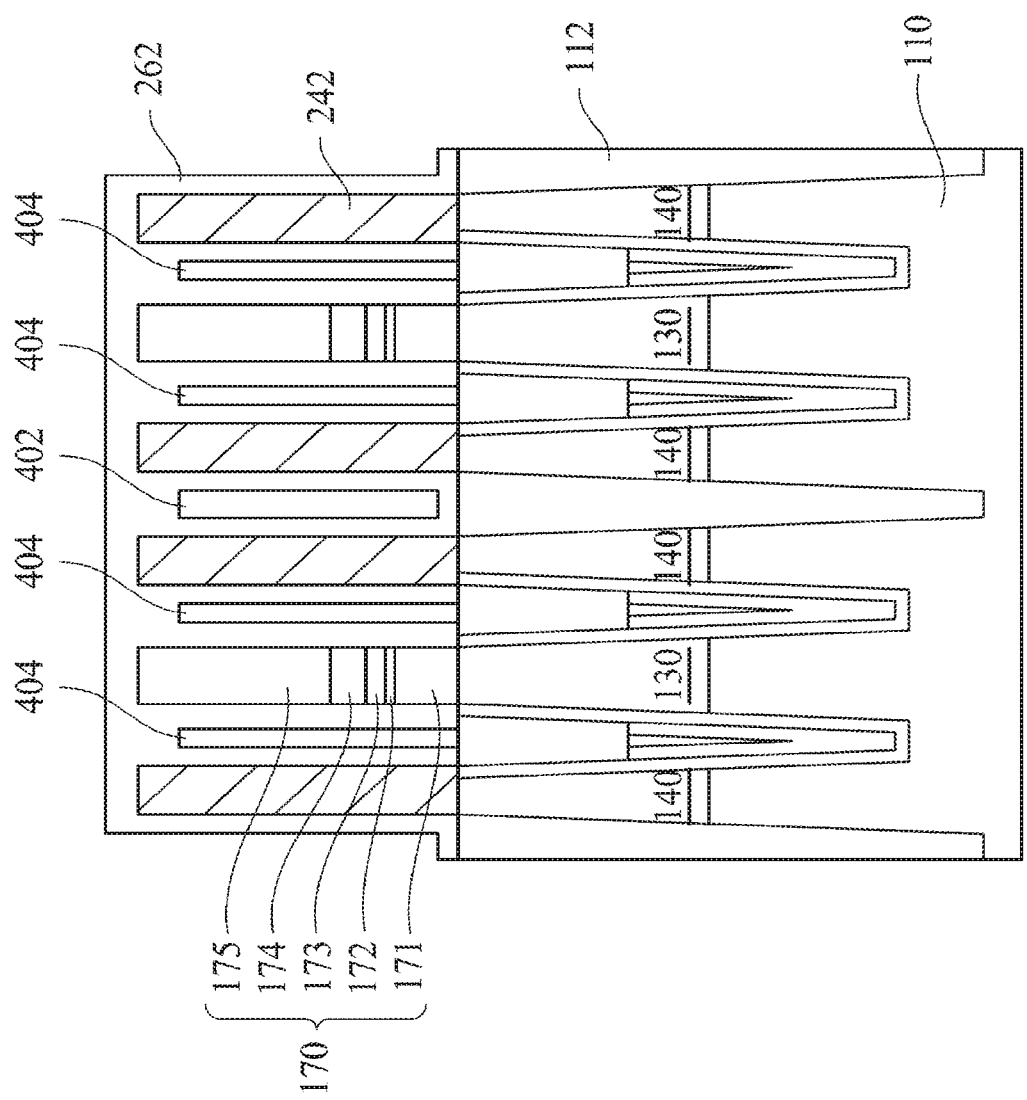

MICROELECTRONIC DEVICES INCLUDING TWO CONTACTS

CROSS-REFERENCE TO RELATED APPLICATION

This application is a divisional of U.S. patent application Ser. No. 14/993,099, filed Jan. 12, 2016, pending, now U.S. Pat. No. 10,388,564, issued Aug. 20, 2019, the disclosure of which is hereby incorporated herein in its entirety by this reference.

BACKGROUND

A Dynamic Random Access Memory (DRAM) is an essential element in many electronic products. To increase component density and improve overall performance of DRAM, continuous efforts are made by industrial manufacturers to reduce the sizes of transistors for the DRAM.

As the transistor size is reduced, a capacitive coupling effect between components or an inter-influence between signals in a single contact and from different active regions may cause a data storage damage. Therefore, a novel memory structure and a manufacturing process thereof are necessary to solve problems mentioned above.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 through FIG. 11 illustrate cross-sectional views of various structures of a memory device at different stages of fabrication in accordance with some embodiments.

DETAILED DESCRIPTION

Figure 1:
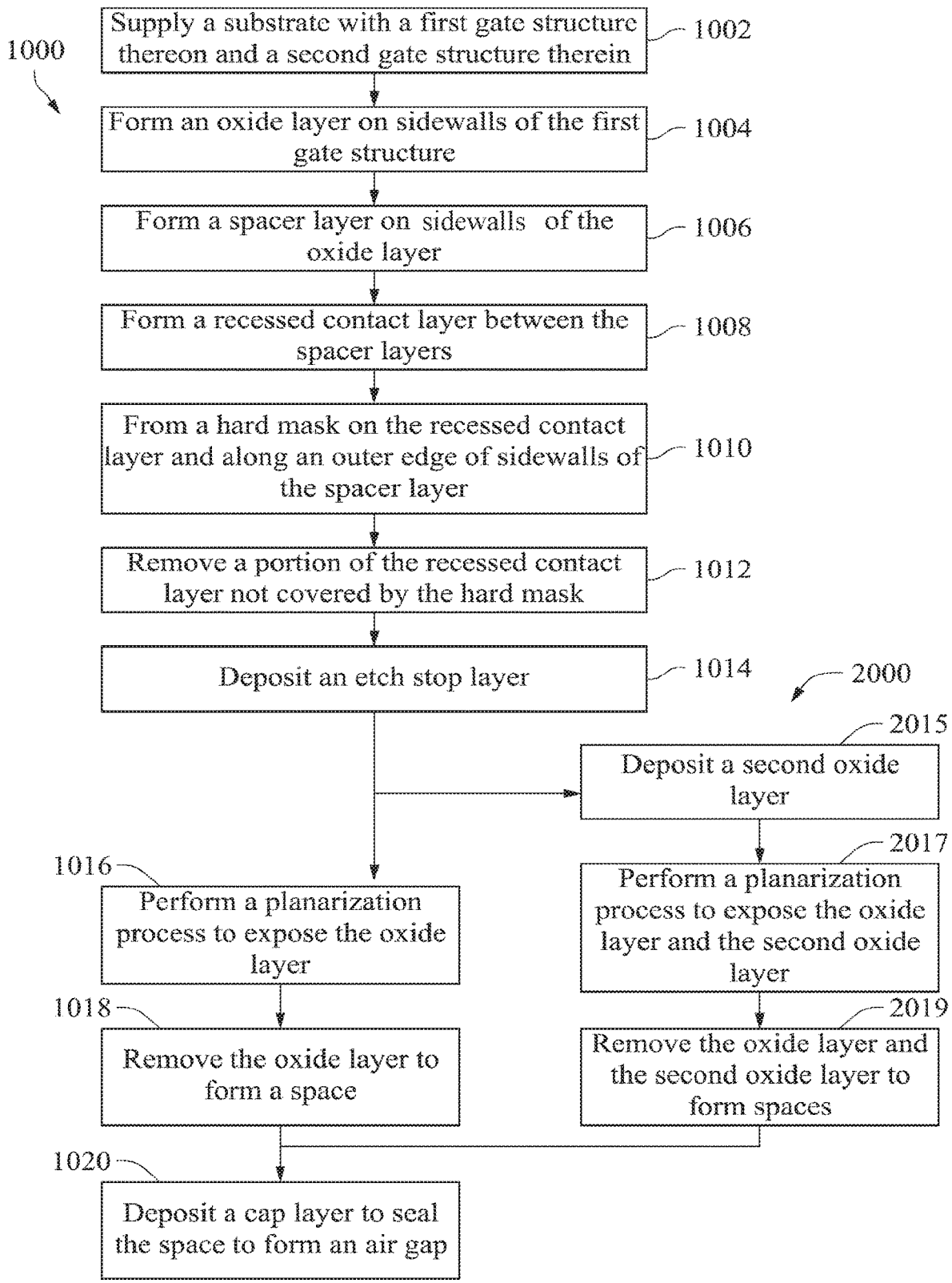
FIG. 1 illustrates flowcharts of an example method for fabricating a memory device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals in the various examples. This repetition is for the purpose of simplicity and clarity and does not in itself dictate a relationship between the various embodiments and/or configurations discussed.

The singular forms "a," "an" and "the" include plural referents unless the context clearly dictates otherwise. Therefore, reference to, for example, a conductive plug includes aspects having two or more such plugs, unless the context clearly indicates otherwise. Further, spatially relative terms, such as "beneath," "below," "lower," "above," "upper," and the like, may be used herein for ease of description to describe one element's or feature's relationship to another element(s) or feature(s) as illustrated in the figures.

In a memory device, a contact, also called a contact plug, is electrically connected to different active regions, such as a source region or a drain region, of adjacent memory cells. The contact is disposed between gate structures and leads out different signals from different active regions of different memory cells during an operation. However, as a contact size scales down, signals from different active regions of different memory cells may interact with each other in the single contact, thus causing data storage damage or lower efficiency in a memory device.

The aforementioned problems result from the single contact. One alternative way to prevent the data storage damage mentioned above from occurring is to interpose a dielectric layer in the contact to separate the contact into two contacts. By interposing a dielectric layer in the contact, an interaction between signals from different active regions of different memory cells may be avoided to increase data storage quality as well as efficiency of operation. Furthermore, as memory device sizes decrease, the sizes of the contact as well as the dielectric layer interposed in the contact are also decreased. Once the width of the dielectric layer interposed in the contact (or a distance between two separated contacts) decreases, a capacitive coupling effect or a parasitic capacitance effect between the two separated contacts may increase and cause a data storage damage or lower efficiency of a memory device again. In this situation, replacing the dielectric layer interposed in the contact with an air gap may enhance electrical insulation, thus the capacitive coupling effect or the parasitic capacitance effect between the two separated contacts may be decreased or eliminated. In the disclosure, a memory device with a dielectric layer (or an air gap) interposed in a contact and a method of manufacturing the same are disclosed below.

Now referring to FIG. 1, which is an exemplary flowchart for manufacturing a memory device according to embodiments of the present disclosure, the flowchart illustrates only a relevant part of the entire manufacturing process. It is understood that additional operations may be provided before, during, and after the operations shown by FIG. 1, and some of the operations described below can be replaced or eliminated for additional embodiments of the method. The order of the operations may be interchangeable.

As shown in FIG. 1, an embodiment method 1000 of manufacturing a memory device with an inter-contact air gap is provided. In step 1002, a substrate with a first gate structure thereon and a second gate structure therein is supplied. In step 1004, an oxide layer is formed on sidewalls of the first gate structure. In step 1006, a spacer layer is formed on sidewalls of the oxide layer. In step 1008, a recessed contact layer is formed between the spacer layers. In step 1010, a hard mask is formed on the recessed contact layer and along sidewalls of an upper portion of the spacer layer. In step 1012, a portion of the recessed contact layer not covered by the hard mask is removed. In step 1014, an etch stop layer is deposited. In step 1016, a planarization process is performed to expose the oxide layer. In step 1018, the oxide layer is removed to form a space. In step 1020, a cap layer is deposited to seal the space to form an air gap. In another embodiment, method 2000 depicts additional steps added into the method 1000; the additional steps include step 2015, step 2017, and step 2019. In step 2015, a second oxide layer is deposited. In step 2017, a planarization process is performed to expose the oxide layer and the second oxide layer. In step 2019, the oxide layer and the second oxide layer are removed to form spaces. Now, the embodiment of method 1000 is discussed first in the following.

Figure 2:
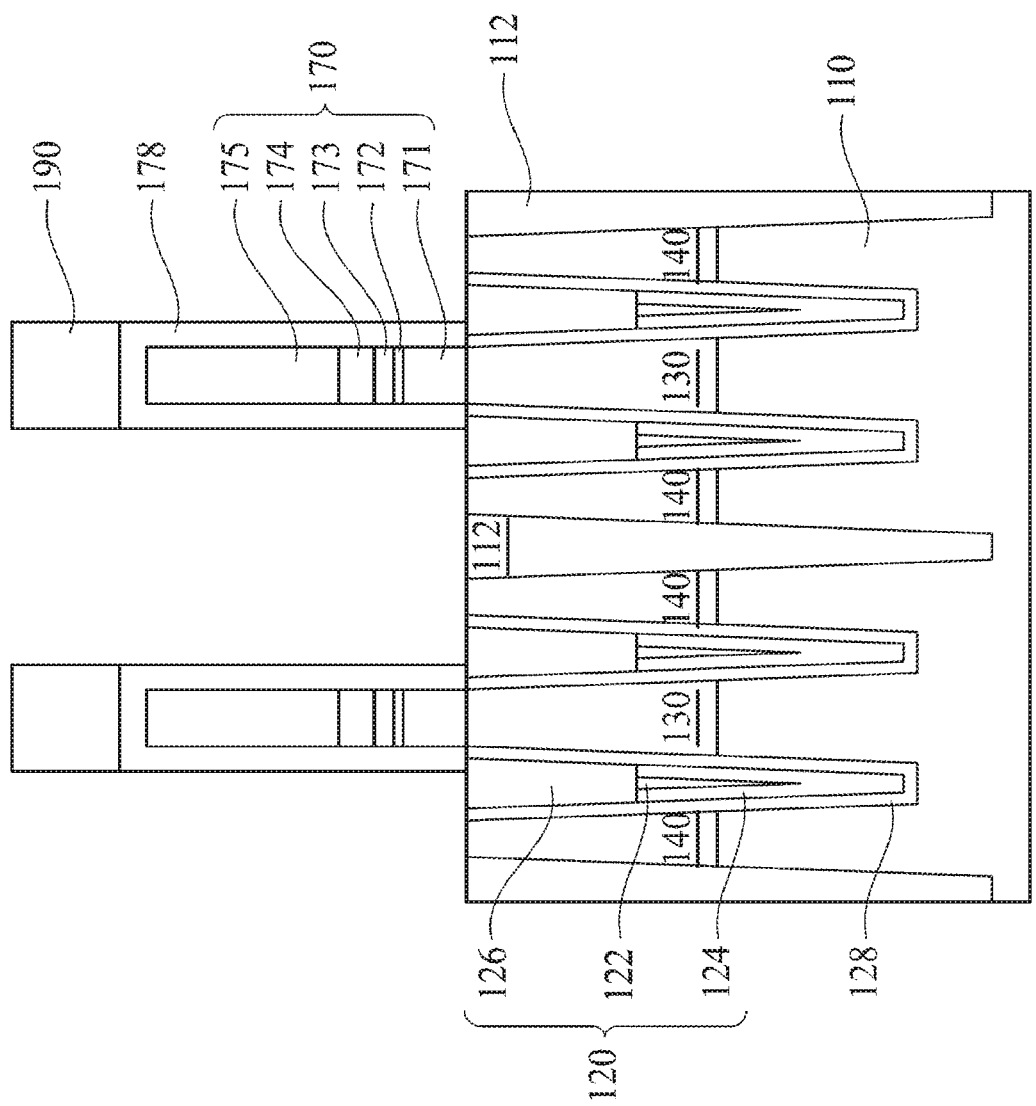

Referring to FIG. 1 and FIG. 2, the method 1000 starts from step 1002 by supplying a substrate 110 with a first gate structure 170 thereon and a second gate structure 120 therein. The substrate 110 may be a bulk silicon substrate. Alternatively, the substrate 110 may comprise an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb); or a combination thereof. Further, the substrate 110 may also include a silicon-on-insulator (SOI) substrate. Generally, an SOI substrate comprises a layer of a semiconductor material such as silicon (Si), germanium (Ge), silicon germanium (SiGe), silicon germanium on insulator (SGOI), or a combination thereof. The SOI substrate is fabricated using separation by implantation of oxygen (SIMOX), wafer bonding, and/or other suitable methods.

In addition, the substrate 110 may comprise a first active region 130, a second active region 140, and a shallow trench isolation 112 (STI). The first active region 130 and the second active region 140 are disposed alternately in the substrate 110 and are separated by the shallow trench isolation 112 and the second gate structure 120, which will be discussed later. The first active region 130 and the second active region 140 may be doped by one or more impurities by any suitable process, such as ion implantation, to form a source region and a drain region of a memory device, respectively. The first active region 130 and the second active region 140 may be an n-type or a p-type doped region depending on design requirements. For example, the n-type doped region may include n-type dopants, such as phosphorus (P), arsenic (As), antimony (Sb), bismuth (Bi), selenium (Se), tellurium (Te), and a combination thereof. While, the p-type doped region may include p-type dopants, such as boron (B), boron difluoride ($BF_2$), and a combination thereof. In some embodiments, the first active region 130 and the second active region 140 may comprise a lightly-doped drain (LDD) region.

Still referring to FIG. 2, the second gate structure 120 is disposed in the substrate 110 between the first active region 130 and the second active region 140. Since the second gate structure 120 is disposed in the substrate 110, the memory device in above-described embodiments can be called a recess access device (RAD). When a bias is applied to the second gate structure 120, a channel can be formed in the substrate 110 and around the second gate structure 120. Current can flow between the first active region 130 and the second active region 140 through the channel. The second gate structure 120 may comprise a single-layer or multi-layer structure. In the embodiment, the second gate structure 120 is a multi-layer structure and comprises a first portion 122, a second portion 124, and optionally a second dielectric stud 126. The first portion 122 and the second portion 124 may respectively comprise a material selected from the group consisting of, for example, but not limited to, silver (Ag), copper (Cu), tungsten (W), titanium (Ti), tantalum (Ta), aluminum (Al), nickel (Ni), ruthenium (Ru), palladium (Pd), platinum (Pt), Manganese (Mn), tungsten nitride (WN), titanium nitride (TiN), tantalum nitride (TaN), aluminum nitride (AlN), tungsten silicide (WSi), molybdenum nitride (MoN), nickel silicide ($Ni_2Si$), titanium silicide ($TiSi_2$), titanium aluminide (TiAl), arsenic (As) doped polycrystalline silicon, zirconium nitride (ZrN), TaC, TaCN, TaSiN, TiAlN, and a combination thereof. The second gate structure 120 may be formed by atomic layer deposition (ALD), physical vapor deposition (PVD), chemical vapor deposition (CVD), or any other suitable process. In some embodiments, the memory device may employ a dual-gate system. In some embodiments, a second dielectric stud 126 may be optionally formed at an upper part of the second gate structure 120. The second dielectric stud 126 functions as an insulating layer or an isolation layer to isolate a conductive part of the second gate structure 120 from the first gate structure 170, which will be discussed later. The second dielectric stud 126 may comprise oxide, nitride, oxynitride, or other suitable materials. In some embodiments, the second dielectric stud 126 comprises an air gap for lower dielectric constant and better electric insulation property.

The second gate structure 120 may further comprise a second gate dielectric layer 128 disposed around the second gate structure 120 and spatially isolating the second gate structure 120 from the first active region 130 and the second active region 140. To be more precise, the second gate dielectric layer 128 is configured to isolate the second gate structure 120 to prevent the current of the second gate structure 120 from leaking to the first active region 130, the second active region 140, and the substrate 110. Thus, the second gate dielectric layer 128 functions as an insulating layer or an isolation layer and comprises any suitable insulating materials such as, for example, but not limited to, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfSiO, $(Ba,Sr)TiO_3$ (BST), $Al_2O_3$, $Si_3N_4$, silicon oxynitrides (SiON), $SiO_2$, a low-k dielectric material, and a combination thereof. As used herein, the term "low-k dielectric" refers to the material having a dielectric constant, k, smaller than about 3.9, which is the k value of $SiO_2$. In some embodiments, the second gate dielectric layer 128 may be formed by atomic layer deposition (ALD), physical vapor deposition (PVD), chemical vapor deposition (CVD), or any other suitable process.

In addition, the shallow trench isolation (STI) 112 may be formed in the substrate 110 between two adjacent memory cells (not illustrated) to provide electrical isolation. In some embodiments, the shallow trench isolation (STI) 112 may comprise dielectric materials, such as silicon oxide, nitride, oxynitride, or a material similar to a material of the second gate dielectric layer 128 as mentioned above. In some embodiments, the shallow trench isolation (STI) 112 may be formed by any oxidation process, such as wet or dry thermal oxidation in ambient comprising oxygen, $H_2O$, NO, or a combination thereof, or by chemical vapor deposition (CVD) techniques using tetraethylorthosilicate (TEOS) and oxygen as a precursor.

Still referring to FIG. 2, the first gate structure 170 is formed on the substrate 110 and electrically connected to the first active region 130. The first gate structure 170 may be a conductive line, such as a digit line, a word line, or a bit line. In some embodiments, the first gate structure 170 may be a one-layer structure or a multi-layer structure comprising a stack layer composed of polycrystalline silicon, metal and dielectric material. In the embodiment, the first gate structure 170 comprises a polycrystalline silicon layer 171, a plurality of metal layers 172, 173, and 174 and a dielectric cap 175, which may be optionally formed on a top surface of the metal layer 174. In some embodiments, the first gate structure 170 simply comprises a polycrystalline silicon layer, a metal layer and, optionally, a dielectric cap. The metal layers 172, 173, and 174 may comprise a material similar to a material of the first portion 122, as mentioned above. The dielectric cap 175 may comprise a material similar to a material of the second dielectric layer 128 as mentioned before, and function as an insulating layer to prevent current from the metal layer 174 from leaking.

In addition, a sidewall spacer 178 may be formed on sidewalls of the first gate structure 170. In some embodiments, the sidewall spacer 178 may cover a top surface of the first gate structure 170 as shown in FIG. 2. The sidewall spacer 178 may be made of oxide, nitride, oxynitride, or any other suitable dielectric materials, and functions as an insulating layer or an etch stop layer for the first gate structure 170. Furthermore, a first dielectric stud 190 composed of oxide, nitride, oxynitride, or other suitable materials, may be optionally formed on the first gate structure 170 for a desired structure or a unique manufacturing process.

Figure 3:
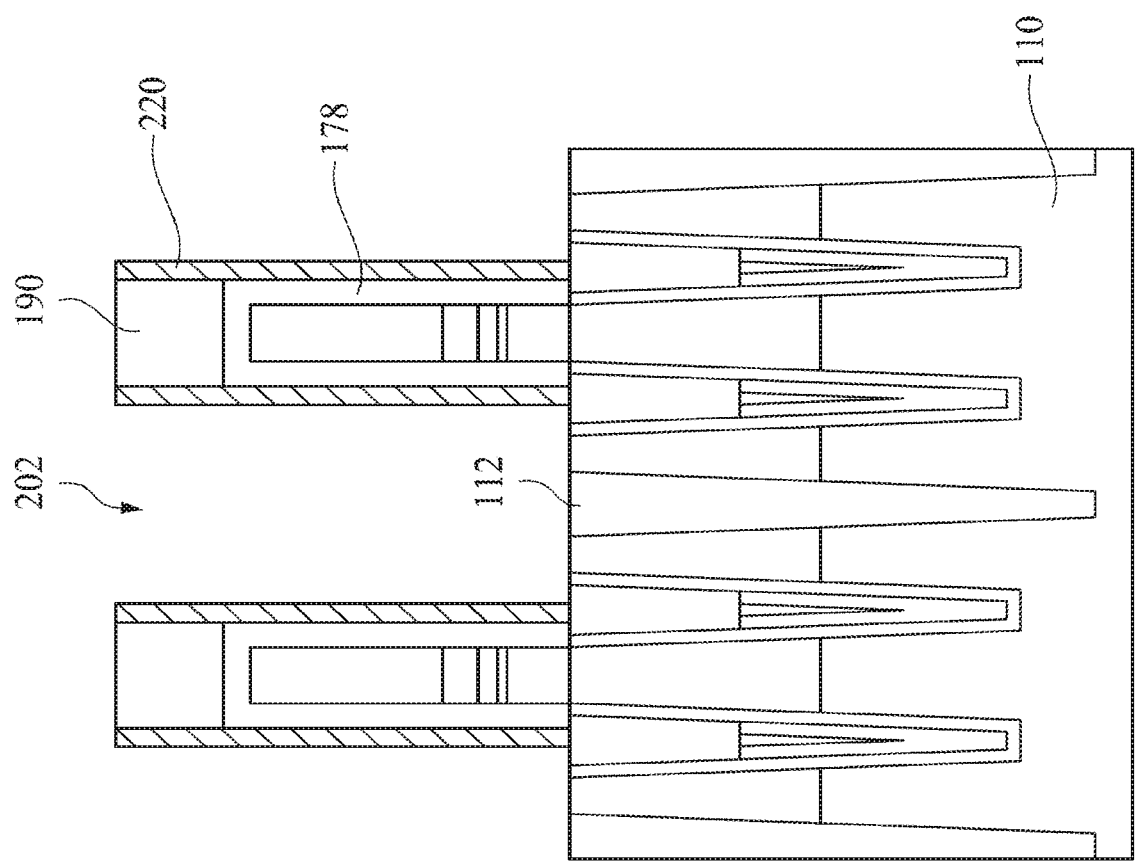

Referring to FIG. 1 and FIG. 3, the method 1000 proceeds to step 1004 by forming an oxide layer 220 along sidewalls of the sidewall spacer 178. As shown in FIG. 3, the oxide layer 220 may be formed by a series of the following processes: first, an oxide layer (not shown) is deposited on the substrate 110, which fills a trench 202 between two sidewall spacers 178 and covers a top surface of the first dielectric stud 190; next, performing a photolithography technique comprising depositing a photoresist layer (not shown) on the oxide layer; patterning the photoresist layer; and removing a portion of the resist layer to form an opening (not shown). Then, a portion of the oxide layer not covered by the patterned resist layer is removed through the opening by a suitable process, such as, but not limited to, dry etching, wet etching, plasma etching, or a combination thereof. Thus, the oxide layer 220 is formed on the sidewalls of the sidewall spacer 178. The oxide layer 220 may comprise silicon oxide or any other suitable material. It should be noted that the oxide layer 220 will be removed to form a space in following steps, which will be discussed in detailed later. In other embodiments, the oxide layer 220 may be formed on a portion of a top surface of the substrate 110 within the trench 202. In yet other embodiments, the oxide layer 220 may be formed on a top surface of the first dielectric stud 190. In some embodiments, the oxide layer 220 may be further formed in the second dielectric stud 126 by selectively removing the second dielectric stud 126 before depositing the oxide layer 220. That is to say, the space, a pre-structure of an air gap, formed afterward may be adjusted by the position or shape of the oxide layer 220.

Figure 4:
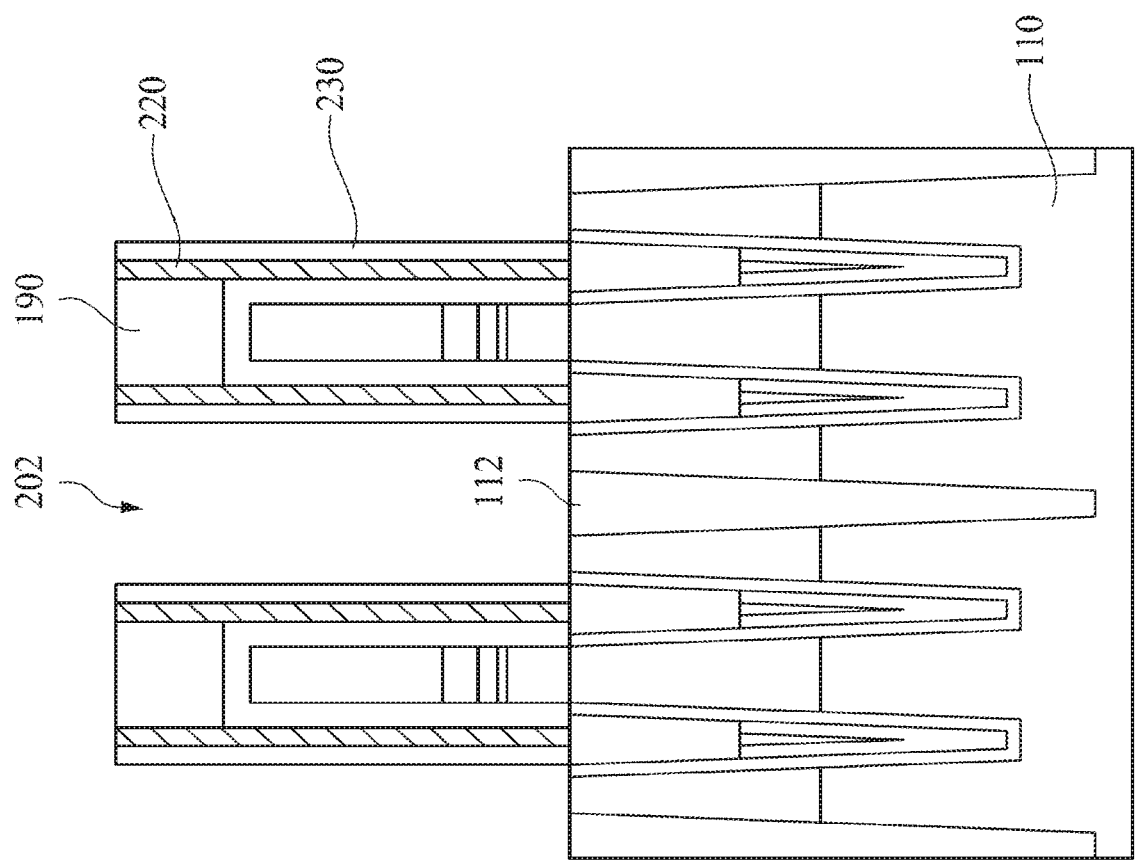

Referring to FIG. 1 and FIG. 4, the method 1000 proceeds to step 1006 by forming a spacer layer 230 on sidewalls of the oxide layer 220. As shown in FIG. 4, the spacer layer 230 may be formed by a series of the following processes: first, a spacer layer (not shown) is deposited on the substrate 110, which fills a trench 202 between two oxide layers 220 and covers a top surface of the first dielectric stud 190 and the oxide layer 220; followed by performing a photolithography technique comprising depositing a photoresist layer (not shown) on the spacer layer 230; patterning the photoresist layer; and removing a portion of the resist layer to form an opening (not shown). Then, a portion of the spacer layer 230 not covered by the patterned resist layer is removed through the opening by a suitable process, such as, but not limited to, dry etching, wet etching, or plasma etching. Thus, the spacer layer 230 is formed on the sidewalls of the oxide layer 220. The spacer layer 230 may comprise nitride or a material similar to a material of the sidewall spacer 178, as mentioned before. It should be noted that the spacer layer 230 functions as a protective layer or an etch stop layer in an etching process to remove the oxide layer 220, which will be discussed later.

Figure 5:
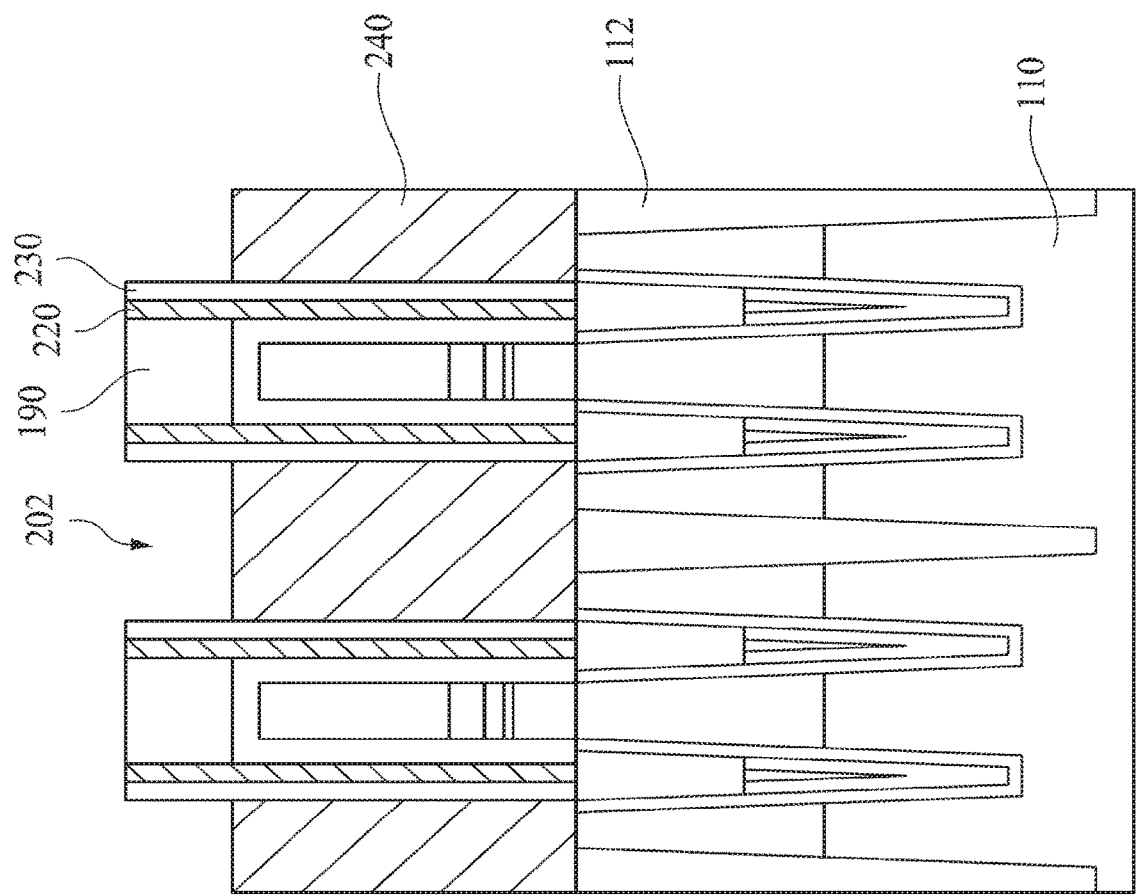

Referring to FIG. 1 and FIG. 5, the method 1000 proceeds to step 1008 by forming a recessed contact layer 240 in the trench 202. As shown in FIG. 5, the recessed contact layer 240 may be formed by depositing a contact layer (not shown) in the trench 202 and then recessing the contact layer to form the contact layer 240. In the embodiment, the trench 202 is overfilled with the contact layer 240, followed by performing a removing process, such as, for example, chemical-mechanical polishing (CMP), wet etching, dry etching, plasma etching, or a combination thereof, to expose the first dielectric stud 190, the oxide layer 220, and the spacer layer 230. Then, a photoresist layer (not shown) is deposited and then patterned through photolithography technique to form an opening (not shown). Finally, the contact layer 240 is recessed by a suitable process, such as dry etching, wet etching, or plasma etching, through the opening to form the recessed contact layer 240. The recessed contact layer 240 may comprise polycrystalline silicon or any suitable material. In some embodiments, the recessed contact layer 240 with polycrystalline silicon is doped with n-type dopants (i.e., P, As, Sb, Bi, Se, or Te) or p-type dopants (i.e., B or $BF_2$) to enhance an electrical conductivity thereof.

Figure 6:
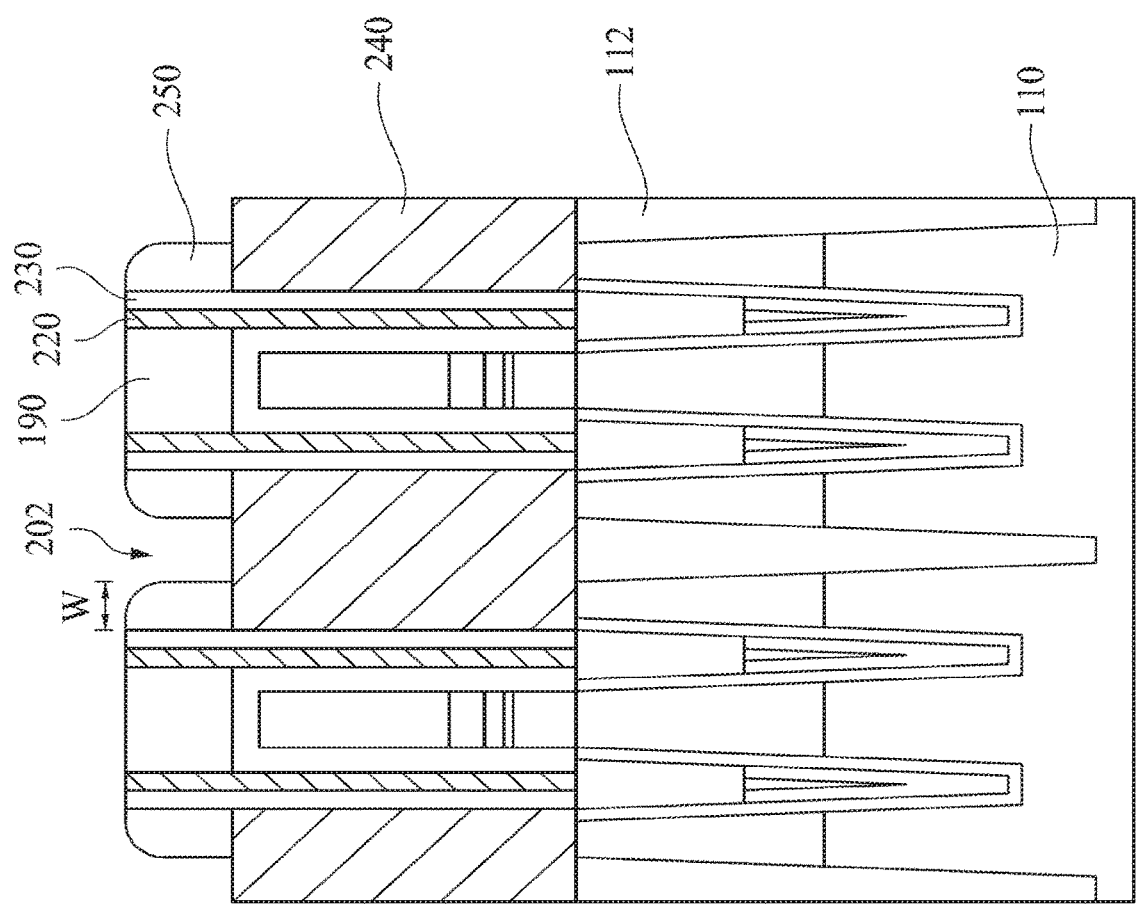

Referring to FIG. 1 and FIG. 6, the method 1000 proceeds to step 1010 by forming a hard mask 250 on the recessed contact layer 240 and along an outer edge of an upper portion of the spacer layer 230. As shown in FIG. 6, the hard mask 250 may be formed by depositing a hard mask layer (not shown) on the recessed contact layer 240 within the trench 202 and then followed by depositing a photoresist layer (not shown) on the hard mask layer, patterning the photoresist layer through photolithography technique to form an opening (not shown), and removing a portion of the hard mask layer through the opening to expose the recessed contact layer 240. It should be noted that a thickness (W) of the hard mask 250 defines a thickness of the contact, which will be discussed later, while a distance between the two hard masks 250 defines a maximum thickness of a second air gap, which will be discussed later. As known for one skilled in the art, the thickness of the contact and the thickness of the inter-contact dielectric layer (i.e., the second air gap) have a high impact on a performance of a memory device. For example, insufficient thickness of the inter-contact dielectric layer (i.e., the second air gap) may result in parasitic capacitance between two contacts, while insufficient thickness of the contact may cause higher electric resistance therein. Thus, a better performance of a memory device may be achieved by properly adjusting the thickness of the hard mask 250 (W) to obtain a desired thickness of the contact and the inter-contact dielectric layer (i.e., the second air gap).

Figure 7:
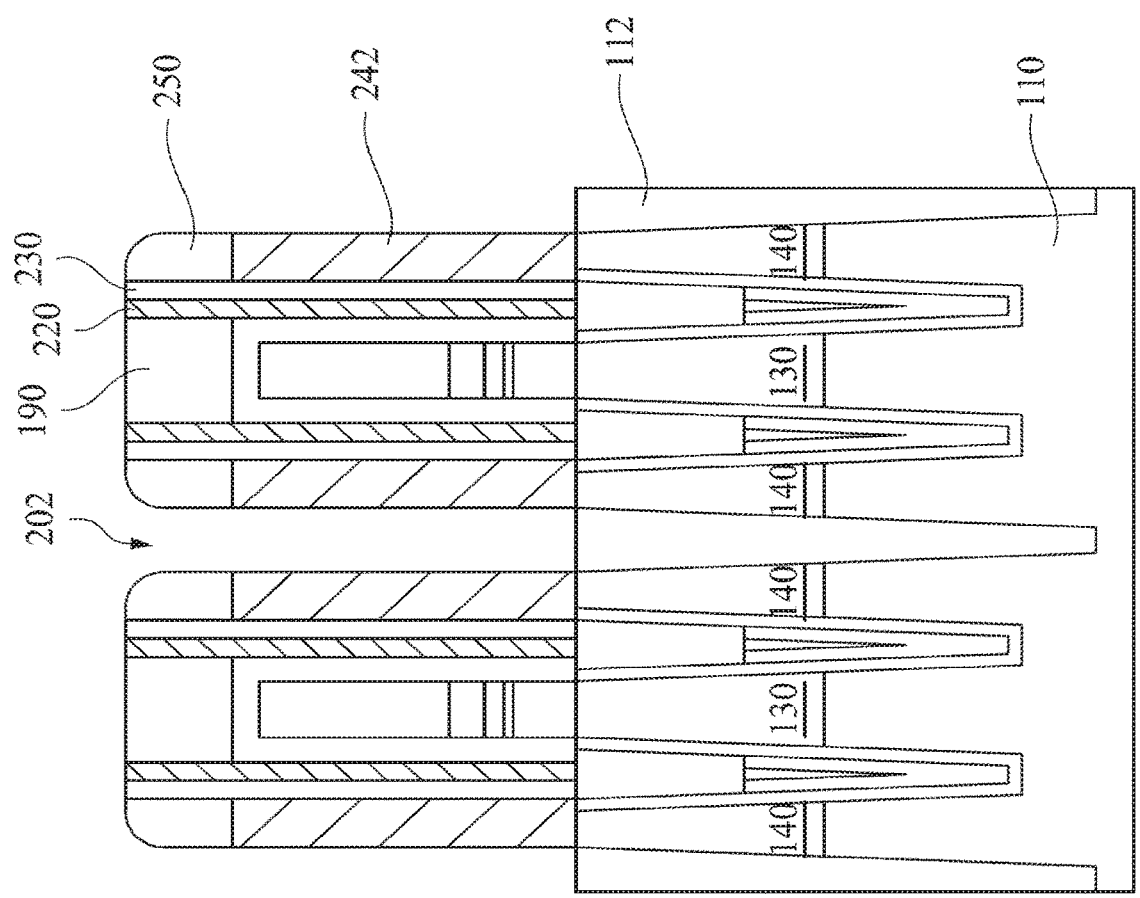

Referring to FIG. 1 and FIG. 7, the method 1000 proceeds to step 1012 by removing a portion of the recessed contact layer 240 to expose the substrate 110 and form a contact 242. As shown in FIG. 7, a portion of recessed contact layer 240 within the trench 202 is removed through any suitable process such as dry etching, wet etching, or plasma etching, to expose the substrate 110. Thus, the contact 242 is formed on sidewalls of the spacer layer 230 and right below the hard mask 250. That is to say, the contact 242 is aligned with the hard mask 250 and has a same thickness (W). In the embodiment, each of the contacts 242 is electrically connected to a different second active region 140 of different cell units, respectively. In other embodiments, the contact 242 may be electrically connected to different types of active regions depending on design requirements. It should be noted that each of the contacts 242 is separated from each other so that each contact 242 may operate independently without inter-influence between contacts electrically connected to different active regions from different cell units (not shown). Thus a signal transmission or data storage of different cell units may be improved.

Referring to FIG. 1 and FIG. 8, the method 1000 proceeds to step 1014 by depositing an etch stop layer 260 over the substrate 110. As shown in FIG. 8, a top surface of the substrate 110, the first dielectric stud 190, the oxide layer 220, the spacer layer 230, and the hard mask 250, as well as sidewalls of the contact 242 and the hard mask 250 are covered by the etch stop layer 260. The etch stop layer 260 provides protection for the substrate 110 as well as the contact 242 during an etching process, which will be discussed later. Furthermore, the etch stop layer 260 also defines a thickness of an inter-contact dielectric layer (i.e., second air gap), which will be formed in the trench 202. In the embodiment, the thickness of the etch stop layer 260 is properly chosen to provide sufficient protection for the substrate 110 and the contact 242 during an etching process, which will be mentioned later. In some embodiments, the trench 202 is filled with etch stop layer 260, which will not be removed in a subsequent etching process to function as an inter-contact dielectric layer. The etch stop layer 260 may be composed of oxide, nitride, oxynitride, or other suitable materials. In some embodiments, the etch stop layer 260 may comprise a dielectric material and can be viewed as a dielectric layer.

Figure 9A:
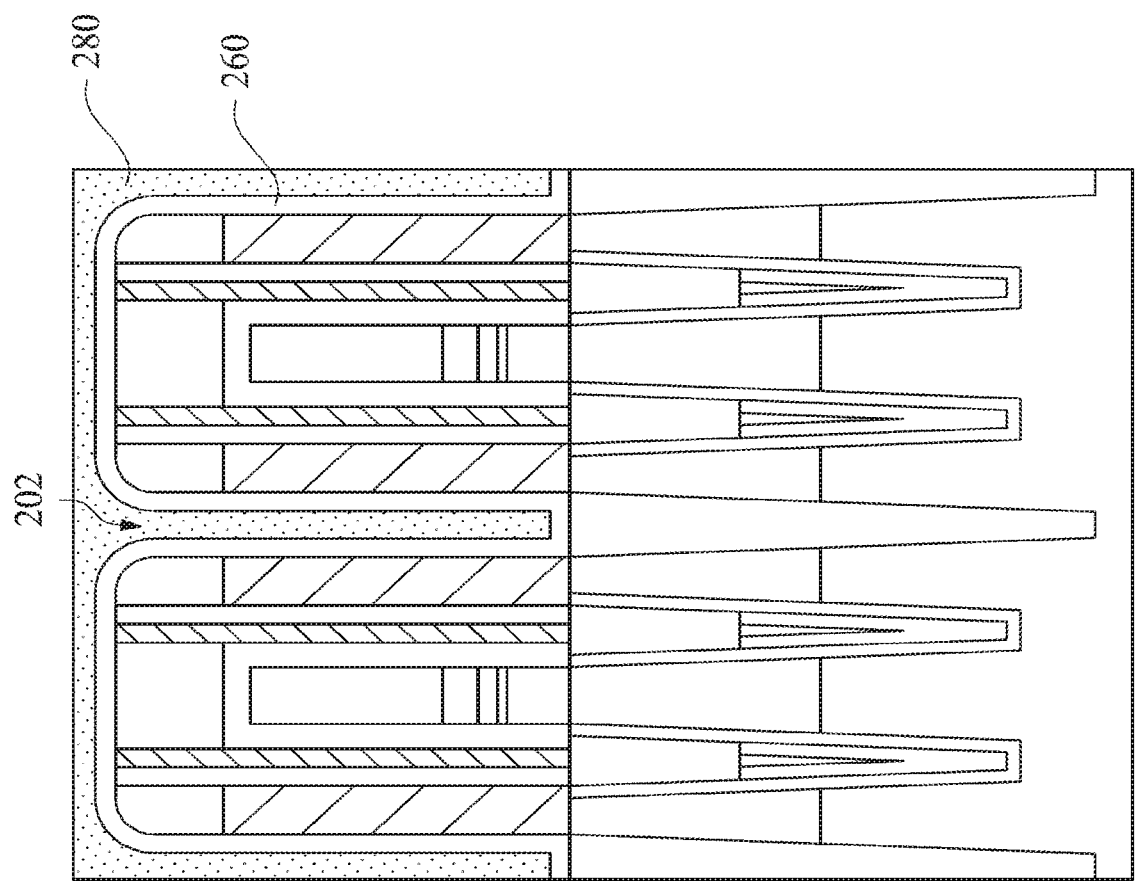
Figure 9B:
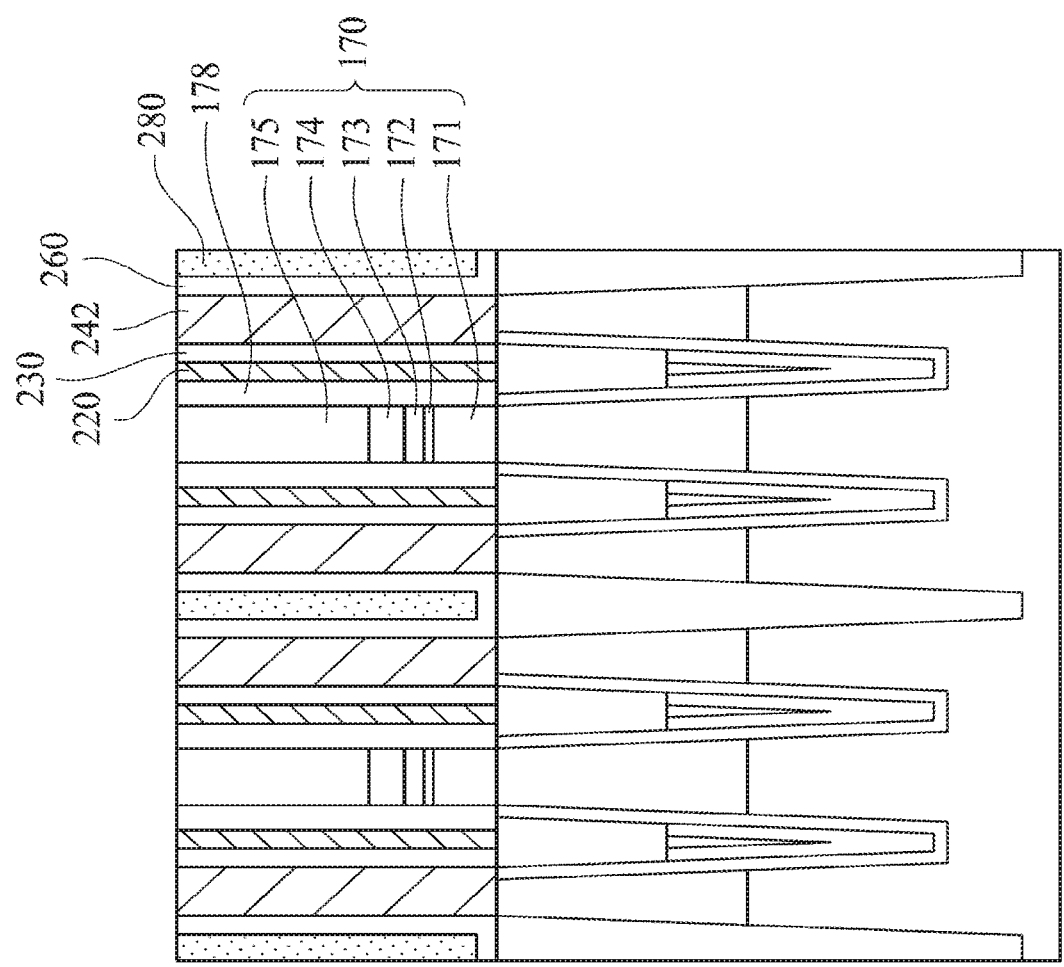
Figure 9C:
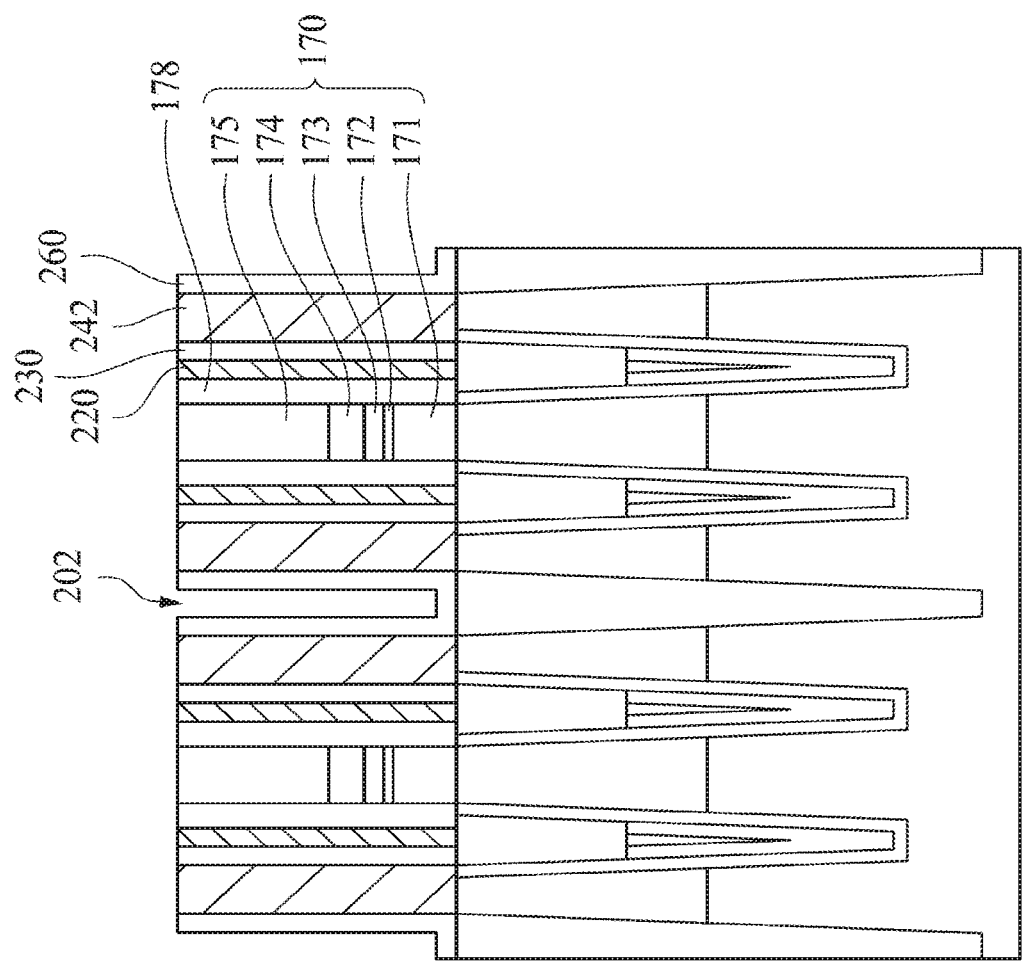

Referring to FIG. 1 and FIG. 9C, the method 1000 proceeds to step 1016 by truncating the memory device to expose the oxide layer 220. In the embodiment, the oxide layer 220 and the dielectric cap 175 may be exposed by performing a suitable process such as chemical-mechanical polishing (CMP) or an etching process. In some embodiments, a part of the metal layers 172, 173, and 174, or the polycrystalline silicon layer 171 may be exposed for design requirements. The oxide layer 220 may be removed to form an air gap, which will be discussed later.

Figure 10:
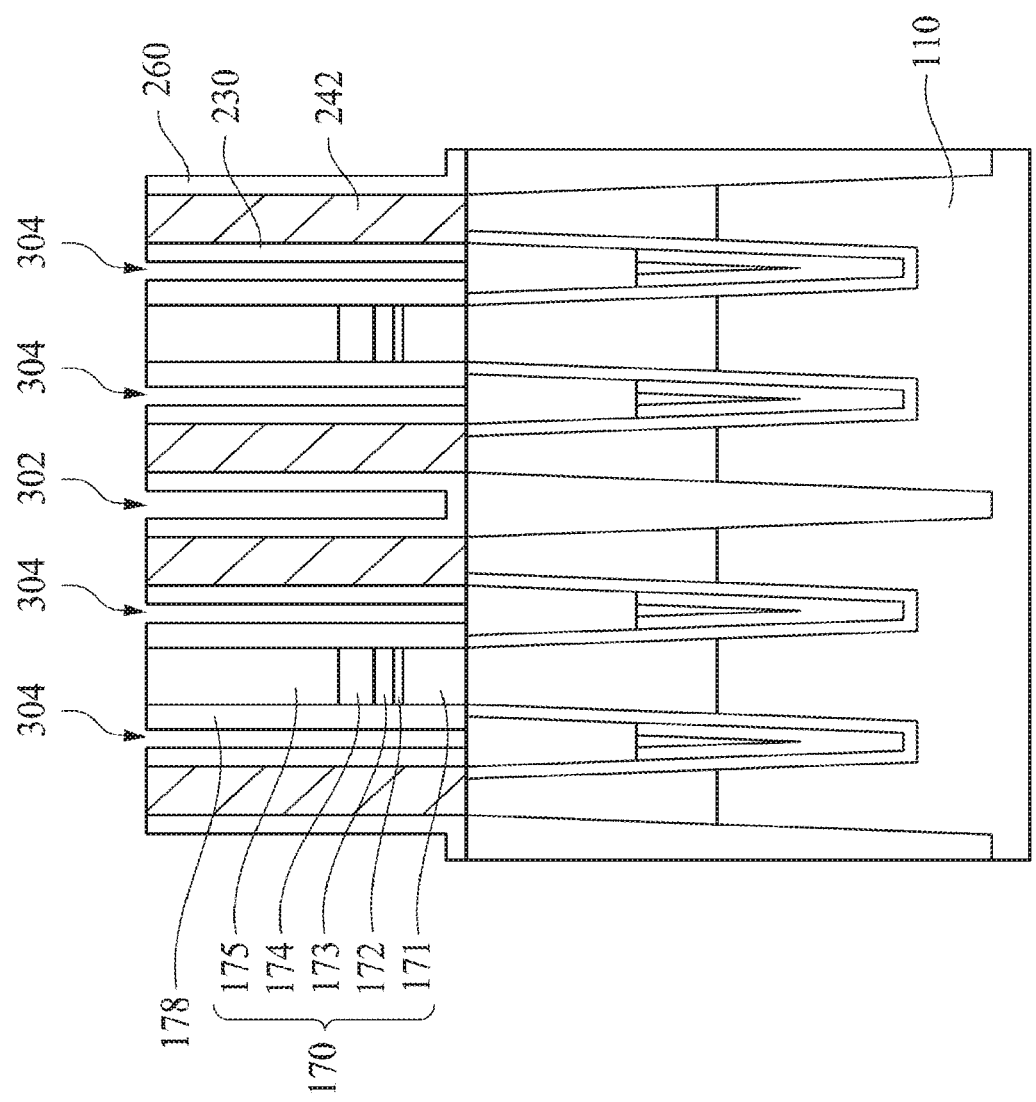

Referring to FIG. 1 and FIG. 10, the method 1000 proceeds to step 1018 by removing the oxide layer 220 to form a space 304. As shown in FIG. 10, the oxide layer 220 may be directly removed by selective etching that has selectivity to the oxide layer 220 instead of other components such as the dielectric cap 175. After the oxide layer 220 is removed, a space 304 is formed, and the aforementioned trench 202 is called a space 302. The spaces 304 and 302 will form an air gap in the following steps, which will be discussed later. In the embodiment, before removing the oxide layer 220, a photolithography technique is performed. The photolithography technique comprises depositing a photoresist layer (not shown) and patterning the photoresist layer to form a patterned photoresist layer with an opening (not shown) right above the oxide layer 220. Then a selective dry etching or selective wet etching is applied to selectively etching the oxide layer 220. It should be noted that the aforementioned etch stop layer 260 protects the contact 242 from being etched away. It should be noted that performing a CM' process to expose the oxide layer 220 and remove the oxide layer 220 subsequently provides a simple and easily controlled way to form an air gap without multiple manufacturing processes of high complexity. In addition, the formed air gap has a pre-determined shape, such as a rectangle shape in a cross-sectional view, which can be easily and precisely controlled.

Referring to FIG. 1 and FIG. 11, the method 1000 proceeds to step 1020 by depositing a cap layer 262 to seal the spaces 304 and 302 to form an air gap 404 and a second air gap 402. As shown in FIG. 11, the second air gap 402 is formed between the contacts 242, while the air gap 404 is formed between the contacts 242 and the first gate structure 170. In the embodiment, the cap layer 262, the spacer layer 230, and the sidewall spacer 178 are composed of a same material so that there is no boundary between the cap layer 262, the spacer layer 230, and the sidewall spacer 178. In other embodiments, the cap layer 262, the spacer layer 230, and the sidewall spacer 178 may comprise different materials for design requirements. The formed air gap 404 and second air gap 402 comprise an air therein. The air gap 404 and the second air gap 402 of gaseous material provide better stress relax function than a general structure filled with solid material. In some embodiments, the space 302 may be filled with a dielectric material to form an inter-contact dielectric layer before the depositing of the cap layer 262. In some embodiments, the spaces 302 and 304 may be independently filled with $O_2$, $N_2$, He, Ar, or other suitable gas, or be vacuumed before the depositing of the cap layer 262. Furthermore, there are no additional sealing layers which may comprise irregular shapes or corners at a top portion thereof is needed but the cap layer 262 for sealing and defining the air gap. That is to say, the formed air gap will have an entire shape, such as a rectangular shape in a cross-sectional view, without any corners or irregular sidewalls that may improve the stability of the memory device and make the manufacturing process easier.

On the other hand, in another embodiment method 2000, additional steps related to an additional oxide layer are added into the method 1000 as mentioned above. The method 2000 starts from a memory device as shown in FIG. 8, and continues after the step 1014 of the method 1000.

Referring to FIG. 1 and FIG. 9A, the method 2000 proceeds to step 2015 by depositing a second oxide layer 280 on the etch stop layer 260, including filling the trench 202, after forming the etch stop layer 260. In the embodiment, the second oxide layer 280 comprises the same material as the oxide layer 220. In other embodiments, the second oxide layer 280 may comprise a material different from the oxide layer 220. In other embodiments, the second oxide layer 280 may comprise other dielectric material.

Referring to FIG. 1 and FIG. 9B, the method 2000 proceeds to step 2017 by performing a planarization process to expose both the second oxide layer 280 and the oxide layer 220. As mentioned above, the planarization process may comprise chemical-mechanical polish (CMP), dry etching, wet etching, plasma etching, or a combination thereof. As mentioned before, the manufacturing process in the disclosure provides an easy and well-controlled way to form an air gap in a memory device. In the disclosure, after all layers and structures are formed, the planarization process is used to expose a part planned to be removed to form the air gap. Thus, a subsequent removing process can directly and easily remove the exposed part to form the air gap. By using the manufacturing processes in the disclosure, a stability of a memory device can be increased and a process window can be enlarged.

Referring to FIG. 1 and FIG. 10, the method 2000 proceeds to step 2019 by removing the second oxide layer 280 and the oxide layer 220. As shown in FIG. 10, the oxide layer 220 and the second oxide layer 280 may be removed by the aforementioned selective etching process in step 1018 to form spaces 302 and 304 and then followed by depositing the cap layer 262 to seal spaces 302 and 304. As mentioned, the second oxide layer 280 becomes second air gap 402 while the oxide layer 220 becomes air gap 404 after the removal process. It should be noted that in method 2000, the second oxide layer 280 in the trench 202 provides better protection for a portion of the etch stop layer 260 within the trench 202. In other words, during the step 1018 of removing the oxide layer 220, the portion of the etch stop layer 260 within the trench 202 may be over etched to expose the substrate 110 and/or the shallow trench isolation (STI) 112 that cause damage to a memory device. Thus, the second oxide layer 280 provides a more uniform etching rate for the etching process and enlarges a process window. In the embodiment, the memory device manufactured by the method 2000 has the same structure as the memory device manufactured by the method 1000 shown in FIG. 11. It should be noted that second oxide layer 280 may be retained without being removed, by depositing another etch stop layer over the second oxide layer 280 again after performing the planarization process. By keeping the second oxide layer 280, the second oxide layer 280 will form a dielectric layer between two contacts 242.

It should be recognized that the memory device of FIG. 11 may include several other layers, structures, features, and so on in practical applications. That is to say, the basic and example memory device of FIG. 11 is provided for context only. Thus, the present disclosure should not be limited to the memory device as configured and depicted in FIG. 11.

The embodiments of the present disclosure discussed above have advantages over existing memory devices and processes, and the advantages are summarized below. The memory device of the present disclosure is a novel structure, which applies the inter-contact dielectric layer between adjacent contacts to reduce an inter-influence between current signals from different active regions of different cell units that may cause data storage damage or lower operation efficiency. In addition, the present disclosure further replaces solid dielectric material of the inter-contact dielectric layer with a gaseous material or a vacuum for increasing electrical insulation thereof. Thus, the capacitive coupling effect or the parasitic capacitance effect between two contacts can be effectively reduced or eliminated. Further, the air gap of gaseous material provides better stress relax function than a general structure filled with solid material. Accordingly, the performance of the memory device can be improved.

In accordance with some embodiments of the present disclosure, a memory device comprises a gate structure disposed on a substrate, two contacts disposed between the adjacent gate structures, and a cap layer over the two contacts to define a space therein.

In accordance with some embodiments of the present disclosure, a method for fabricating a memory device is disclosed. The method comprises forming a plurality of conductive lines having trenches therebetween; forming a contact layer in the trench; and forming a dielectric layer interposed in the contact layer and configured to divide the contact layer into two contacts.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A microelectronic device, comprising:
   a base material;
   shallow trench isolation regions located in the base material;
   gate structures located adjacent one another on the base material, the gate structures extending in a first horizontal direction and having trenches extending laterally therebetween;
   two contacts located in individual trenches extending in the first horizontal direction between the adjacent gate structures, the two contacts laterally adjacent one another and aligned in a straight line in a second horizontal direction between the adjacent gate structures, wherein upper surfaces of each of the gate structures and the two contacts are substantially coplanar with one another; and
   a cap material located over the gate structures and the two contacts to define a first air gap located over one of the shallow trench isolation regions and only between the two contacts and to define a second air gap located between one of the gate structures and one of the two contacts.

2. The microelectronic device of claim 1, wherein at least one of the first air gap and the second air gap is filled with a gaseous material.

3. The microelectronic device of claim 2, wherein the gaseous material comprises air.

4. The microelectronic device of claim 1, wherein at least one of the first air gap and the second air gap comprises a vacuum.

5. The microelectronic device of claim 1, wherein the base material comprises a cell unit comprising a first active region and a second active region therein.

6. The microelectronic device of claim 5, wherein one of the gate structures is electrically connected to the first active region.

7. The microelectronic device of claim 5, wherein each of the two contacts is electrically connected to the second active region of a respective cell unit.

8. The microelectronic device of claim 1, further comprising a dielectric material on sidewalls of the two contacts.

9. The microelectronic device of claim 1, further comprising a second dielectric material on sidewalls of the gate structures.

10. The microelectronic device of claim 1, wherein the first air gap and the second air gap are aligned in a straight line in the second horizontal direction between the adjacent gate structures.

11. A microelectronic device, comprising:
    shallow trench isolation regions in a base material;
    recessed gate structures located in the base material, wherein two of the recessed gate structures are located between adjacent shallow trench isolation regions;
    additional gate structures located adjacent one another on the base material and extending in a first horizontal direction;
    two contacts located within an opening extending in the first horizontal direction between the adjacent additional gate structures, the two contacts laterally adjacent one another and aligned in a straight line in a second horizontal direction between the adjacent additional gate structures; and a single cap material located directly over the additional gate structures and the two contacts to define a first space comprising a first air gap located over one of the shallow trench isolation regions and only between the two contacts and to define a second space comprising a second air gap located between one of the additional gate structures and one of the two contacts.

12. The microelectronic device of claim 11, further comprising:
a first dielectric material located on sidewalls of each of the additional gate structures; and
a second dielectric material located on sidewalls of each of the two contacts, wherein each of the first dielectric material, the second dielectric material, and the cap material comprise the same material with no boundaries therebetween.

13. The microelectronic device of claim 11, wherein the first space is located over one of the shallow trench isolation regions, the shallow trench isolation regions being devoid of gate structures.

14. A microelectronic device, comprising:
shallow trench isolation regions in a base material;
gate structures located adjacent one another on the base material and extending in a first horizontal direction;
two contacts located within an opening extending in the first horizontal direction between the adjacent additional gate structures, the two contacts laterally adjacent one another and aligned in a straight line in a second horizontal direction between the adjacent gate structures; and
a cap material located over the gate structures and the two contacts to define a first space comprising a first air gap located over one of the shallow trench isolation regions and only between the two contacts and to define a second space comprising a second air gap located between one of the gate structures and one of the two contacts, wherein the first air gap is separated from the base material by a dielectric material and the second air gap is in direct physical contact with the base material.

15. The microelectronic device of claim 11, wherein the second space is located over one of the recessed gate structures.

16. The microelectronic device of claim 11, further comprising a third space located in an upper region of at least some of the recessed gate structures, wherein the recessed gate structures comprise multi-layer structures.

17. The microelectronic device of claim 11, further comprising first active regions and second active regions in the base material, wherein:
the first active regions are laterally spaced between adjacent recessed gate structures; and
the second active regions are laterally spaced between one of the recessed gate structures and one of the shallow trench isolation regions with each of the shallow trench isolation regions being bordered by two of the second active regions.

18. The microelectronic device of claim 17, wherein individual additional gate structures are located over the first active regions and each of the two contacts are located over respective second active regions.

19. The microelectronic device of claim 17, wherein one of the first active regions or the second active regions comprises source regions, and the other of the first active regions or the second active regions comprises drain regions.

* * * * *

UNITED STATES PATENT AND TRADEMARK OFFICE
CERTIFICATE OF CORRECTION

PATENT NO. : 10,854,514 B2  
APPLICATION NO. : 16/391600  
DATED : December 1, 2020  
INVENTOR(S) : Tieh-Chiang Wu, Wen-Chieh Wang and Sheng-Wei Yang Page 1 of 1

It is certified that error appears in the above-identified patent and that said Letters Patent is hereby corrected as shown below:

In the Specification

| | | |
|---|---|---|
| Column 1, | Line 8, | change "filed Jan. 12, 2016, pending, now U.S." to --filed Jan. 12, 2016, now U.S.-- |
| Column 4, | Line 31, | change "HfTaO, HfSiO, (Ba,Sr)TiO$_3$" to --HfTaO, HfTiO, (Ba,Sr)TiO$_3$-- |
| Column 7, | Line 61, | change "a CM' process to expose" to --a CMP process to expose-- |

Signed and Sealed this  
Twenty-third Day of February, 2021

Drew Hirshfeld  
*Performing the Functions and Duties of the*  
*Under Secretary of Commerce for Intellectual Property and*  
*Director of the United States Patent and Trademark Office*